US012598902B2

(12) United States Patent
Sun et al.

(10) Patent No.: US 12,598,902 B2
(45) Date of Patent: Apr. 7, 2026

(54) DISPLAY MODULE AND DISPLAY DEVICE

(71) Applicant: BOE Technology Group Co., Ltd., Beijing (CN)

(72) Inventors: Jie Sun, Beijing (CN); Hui Wang, Beijing (CN); Yanming Wang, Beijing (CN); Yage Song, Beijing (CN); Shengji Yang, Beijing (CN); Yongchun Zhang, Beijing (CN); Xiaojun Mao, Beijing (CN); Yunjiang Zhang, Beijing (CN); Meijian Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 686 days.

(21) Appl. No.: 17/779,140

(22) PCT Filed: Jun. 30, 2021

(86) PCT No.: PCT/CN2021/103622
§ 371 (c)(1),
(2) Date: May 24, 2022

(87) PCT Pub. No.: WO2023/272595
PCT Pub. Date: Jan. 5, 2023

(65) Prior Publication Data
US 2024/0172543 A1     May 23, 2024

(51) Int. Cl.
*H10K 59/80* (2023.01)
*H10K 59/131* (2023.01)

(52) U.S. Cl.
CPC ....... *H10K 59/8794* (2023.02); *H10K 59/131* (2023.02); *H10K 59/8792* (2023.02)

(58) Field of Classification Search
CPC ............. H10K 59/8794; H10K 59/131; H10K 59/8792; G09F 9/30; H01L 27/15; H01L 33/52; H05K 1/02
See application file for complete search history.

(56) References Cited

U.S. PATENT DOCUMENTS

| 2006/0166524 A1 | 7/2006 | Ho et al. |
| 2012/0075214 A1 | 3/2012 | Kim |
(Continued)

FOREIGN PATENT DOCUMENTS

| CN | 101609872 A | 12/2009 |
| CN | 203574752 U | 4/2014 |
(Continued)

OTHER PUBLICATIONS

Office Action dated Oct. 31, 2024 for Chinese Patent Application No. 2021800017706 and English Translation.

*Primary Examiner* — Ermias T Woldegeorgis
(74) *Attorney, Agent, or Firm* — Ling Wu; Stephen Yang; Ling and Yang Intellectual Property

(57) ABSTRACT

The embodiment of the present disclosure provides a display module, which includes a circuit board and a display panel provided on a first surface of the circuit board, wherein the display panel includes a display region and a non-display region located at a periphery of the display region; the first surface of the circuit board is also provided with a frame body, the display panel is located within the frame body, a fixing adhesive is filled between a peripheral edge of the display panel and the frame body, and the fixing adhesive also covers the non-display region of the display panel.

17 Claims, 3 Drawing Sheets

(56)          References Cited

U.S. PATENT DOCUMENTS

2017/0255050 A1 *   9/2017   Yoo .................. G02F 1/133308
2018/0157094 A1     6/2018   Lee et al.

FOREIGN PATENT DOCUMENTS

| | | | | |
|---|---|---|---|---|
| CN | 204119318 U | | 1/2015 | |
| CN | 204926712 U | | 12/2015 | |
| CN | 207249286 U | * | 4/2018 | |
| CN | 108803164 A | | 11/2018 | |
| CN | 109658831 A | * | 4/2019 | .......... G06F 1/1652 |
| CN | 110136589 A | | 8/2019 | |
| CN | 210836909 U | * | 6/2020 | |
| CN | 211605158 U | | 9/2020 | |
| CN | 112037673 A | | 12/2020 | |
| CN | 112198981 A | * | 1/2021 | .......... G06F 3/0412 |
| CN | 212461694 U | | 2/2021 | |
| JP | 2009053549 A | * | 3/2009 | |
| KR | 100703616 B1 | * | 4/2007 | ....... G02F 1/133308 |
| KR | 10-2009-0004105 A | | 1/2009 | |
| TW | 200639479 A | | 11/2006 | |
| WO | 2019111594 A1 | | 6/2019 | |
| WO | 2020085368 A1 | | 4/2020 | |

\* cited by examiner

DISPLAY MODULE AND DISPLAY DEVICE

CROSS-REFERENCE TO RELATED APPLICATION

The present application is a U.S. National Phase Entry of International Application No. PCT/CN2021/103622 having an international filing date of Jun. 30, 2021. The above-identified application is hereby incorporated by reference.

TECHNICAL FIELD

The embodiments of the disclosure relate to, but are not limited to, the field of display technologies, and more particularly to a display module and a display device.

BACKGROUND

In some technologies, the display chip of Micro OLED (Micro Organic Light Emitting Diode) display module is attached to the circuit board, and the display chip is partially exposed to air, which easily leads to abnormalities such as edge breakage or scratch of the display chip during use or assembly of the display module, resulting in a failure of the product; in addition, Micro OLED display module also has some problems such as poor heat dissipation of the display chip.

SUMMARY

The following is a summary about the subject matter described in the present disclosure in detail. The summary is not intended to limit the scope of protection of claims.

The embodiment of the present disclosure provides a display module, which includes a circuit board and a display panel provided on a first surface of the circuit board, wherein the display panel includes a display region and a non-display region located at a periphery of the display region; the first surface of the circuit board is further provided with a frame body, the display panel is located within the frame body, a fixing adhesive is filled between a peripheral edge of the display panel and the frame body, and the fixing adhesive covers the non-display region of the display panel.

An embodiment of the present disclosure further provides a display device, which includes the display module.

After reading and understanding the drawings and the detailed description, other aspects may be understood.

BRIEF DESCRIPTION OF DRAWINGS

Accompanying drawings are used to provide further understanding for technical solutions of the present disclosure, constitute a part of the specification, and are used to explain the technical solutions of the present disclosure together with embodiments of the present disclosure, thus do not constitute a limitation on the technical solutions of the present disclosure. The shape and size of the components in the accompanying drawings do not reflect true scale and are only intended to illustrate the contents of the disclosure.

The reference signs are as follows.

10—circuit board, 11—frame body, 12—heat dissipation plate, 13—connector, 14—second bonding pad, 20—display panel, 21—display substrate, 22—cover plate, 30—fixing adhesive, 101—hollow region, 111—first frame, 112—second frame, 201—display region, 211—bonding region.

DETAILED DESCRIPTION

Those of ordinary skill in the art should understand that modification or equivalent replacement can be made to the technical solution of the embodiments of the present disclosure without departing from the spirit and scope of the technical solution of the embodiments of the present disclosure, and should fall within the scope of the claims of the disclosure.

In some technologies, Micro OLED display module is in a form of printed circuit board (PCB), and the electronic component and the display chip are respectively attached to both sides of PCB to be combined with PCB. The display module in form of PCB can work normally just by connecting power supply, with a low cost. However, because the main material of PCB is mostly glass fiber board, the thermal expansion coefficient of PCB is larger than that of display chip, and the display module may easily encounter a deformation of PCB in the working environment, which leads to the delamination of the binding region between display chip and PCB and thus affecting the product life. This problem is more likely to occur on a large-size display chip. In addition, in the display module, the display chip is exposed to air, which easily leads to the abnormality such as edge breakage or scratch of the display chip during the use or assembly of the display module, resulting in the failure of the product. In some other technologies, Micro OLED display module is in a form of flexible printed circuit board (FPC), and the display chip has a poor heat dissipation. In addition, the display chip is exposed to air, which easily leads to abnormality such as edge breakage or scratch of the display chip during the use or assembly of the display module, resulting in the failure of the product.

Figure 1:
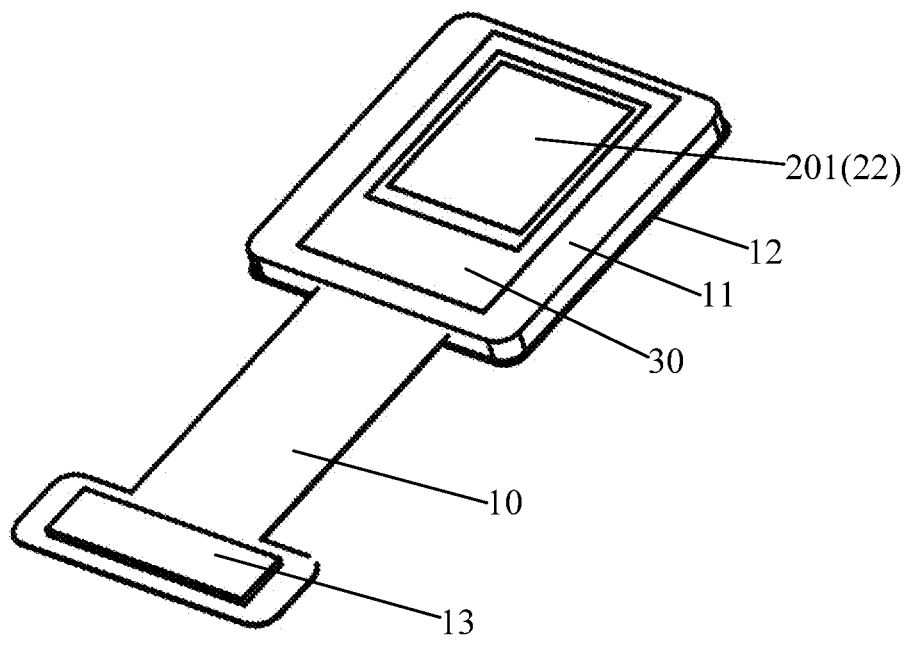
FIG. 1 is a schematic diagram of a structure of a display module according to some exemplary embodiments.
Figure 2:
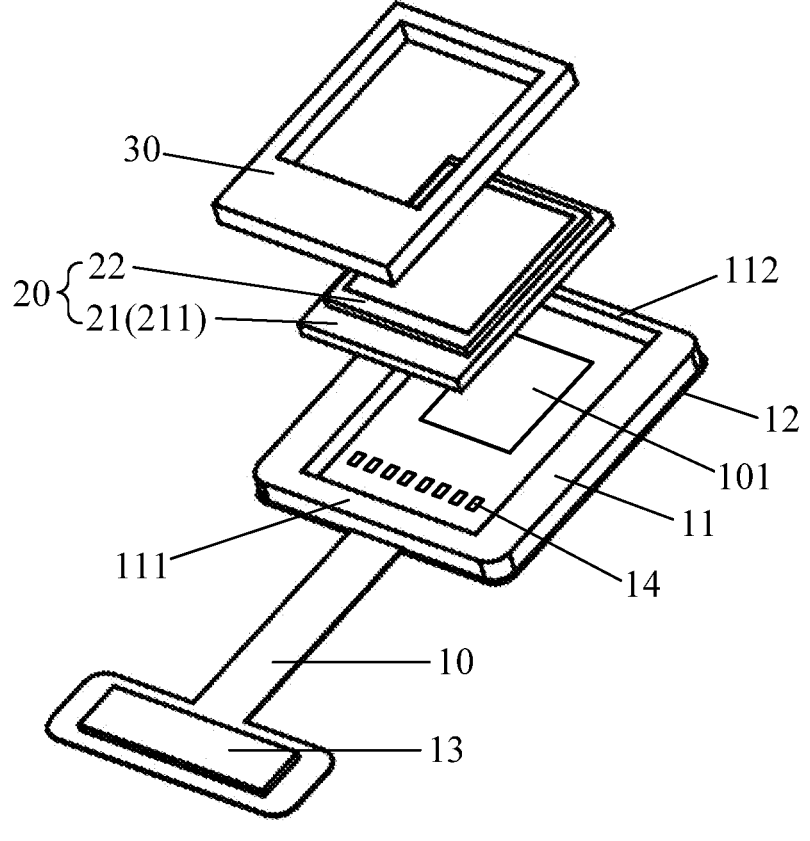
FIG. 2 is an exploded view of the display module of FIG. 1 according to some exemplary embodiments.

An embodiment of the present disclosure provides a display module, by way of example, as shown in FIG. 1 and FIG. 2. FIG. 1 is a schematic diagram of a structure of a display module according to some exemplary embodiments, and FIG. 2 is an exploded view of the display module of FIG. 1. The display module includes a circuit board 10 and a display panel 20 provided on a first surface of the circuit board 10, wherein the display panel 20 includes a display region 201 and a non-display region located at a periphery of the display region 201; the first surface of the circuit board 10 is also provided with a frame body 11, the display panel 20 is located within the frame body 11, a fixing adhesive 30 is filled between a peripheral edge of the display panel 20 and the frame body 11, and the fixing adhesive 30 covers the non-display region of the display panel 20.

The display module of the embodiment of the present disclosure may be a Micro OLED display module. A frame body 11 is provided on the first surface of the circuit board 10, the display panel 20 is located within the frame body 11, and the fixing adhesive 30 is filled between the peripheral edge of the display panel 20 and the frame body 11, and the fixing adhesive 30 covers the non-display region of the display panel 20. Thus, by providing the frame body 11 on the first surface of the circuit board 10, it is advantageous to fill the fixing adhesive 30, so that the fixing adhesive 30 can cover the exposed surface of the non-display region of the display panel 20, thereby protecting the display panel 20. Thus, abnormal problems such as edge breakage or scratch in the non-display region of the display panel 20 can be avoided during use or assembly of the display module.

In some exemplary embodiments, as shown in FIG. 1 and FIG. 2, the display panel 20 may include a display substrate 21 and a cover plate 22 provided on a side of the display substrate 21 facing away from the circuit board 10, wherein the display substrate 21 includes a first region corresponding to a position of the display region 201 and a second region located at a periphery of the first region, the first region is configured to display images and the second region is configured to not to display images; the cover plate 22 completely covers the first region, a peripheral edge of the display substrate 21 can protrude from the cover plate 22. The fixing adhesive 30 is filled between the peripheral edge of the display substrate 21 and the frame body 11, and the fixing adhesive 30 completely covers a surface of the display substrate 21 which is not covered by the cover plate 22. In this way, the fixing adhesive 30 can protect the display substrate 21. The fixing adhesive 30 may use an adhesive with a low viscosity to facilitate the self-levelling of the fixing adhesive 30 after a point coating of the fixing adhesive 30, and after the fixing adhesive 30 is cured, the display panel 20 is adhesively connected to the frame body 11.

In one example of the present embodiment, as shown in FIG. 1 and FIG. 2, the surface of the fixing adhesive 30 facing away from the circuit board 10 may be lower than the surface of the cover plate 22 facing away from the circuit board 10 and lower than the surface of the frame body 11 facing away from the circuit board 10, so that an overflow of the fixing adhesive 30 to the surface of the cover plate 22 and an overflow of the fixing adhesive 30 out of the frame body 11 may be prevented during the point coating of the fixing adhesive 30.

In an example of the present embodiment, as shown in FIG. 2, the second region can include a bonding region 211 located at a side of the first region, and the bonding region 211 is bonded and connected to the circuit board 10.

In an example of the present embodiment, the display substrate can include a driving circuit layer provided on the substrate and a plurality of light emitting devices provided on the driving circuit layer, and the light emitting devices may be OLED devices. The driving circuit layer includes a pixel driving circuit, and the light emitting device is connected with the pixel driving circuit and emits light under a driving of the pixel driving circuit, and the plurality of light emitting devices are located at the first region of the display substrate.

In an example of the present embodiment, the bonding region 211 may be provided with a first bonding pad, and the circuit board 10 may be provided with a second bonding pad 14 (shown in FIG. 2), and the first bonding pad and the second bonding pad 14 may be connected with a metal wire. By way of example, as shown in FIG. 2, the second bonding pad 14 is located within the frame body 11 and not covered by the display panel 20, the bonding region 211 is arranged close to the first frame 111 of the frame body 11, and the second bonding pad 14 is located between the first frame 111 and the bonding region 211, so that the first bonding pad and the second bonding pad 14 can be conveniently bonded and connected by the metal wire. The fixing adhesive 30 is filled between the metal wire and covers the metal wire to protect the metal wire. As an example, the material of the metal wire may be gold, aluminum, copper, or the like, and the metal wire may be connected to the first bonding pad and the second bonding pad 14 by ultrasonic welding, so that, by using a wire bonding process, the bonding pad size may be reduced to 50 um*50 um, thereby reducing an area of the display substrate, thereby reducing wafer cost.

In an example of the present embodiment, as shown in FIG. 2, the frame body 11 may have a rectangular shape. The frame 11 includes the first frame 111 and a second frame 112 opposite to each other, the bonding region 211 is arranged close to the first frame 111 of the frame body 11, and an area of a part of the fixing adhesive 30 close to the first frame 111 is larger than an area of a part of the fixing adhesive 30 close to the second frame 112, so that the fixing adhesive 30 can better protect the bonding region 211.

Figure 3:
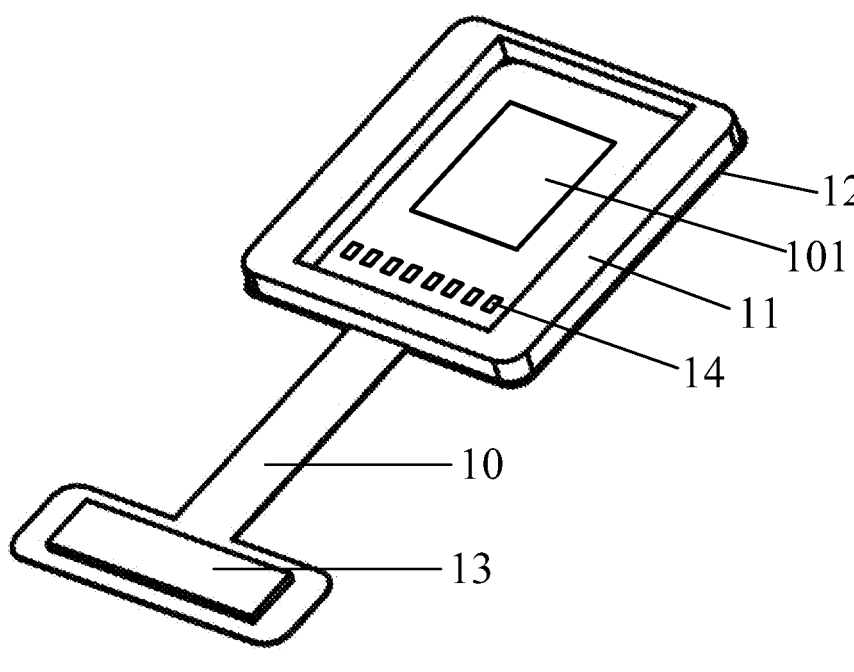
FIG. 3 is a schematic diagram of a structure of the circuit board, the frame body and the heat dissipation plate in the display module of FIG. 2 being pressed into an integrated structure.
Figure 4:
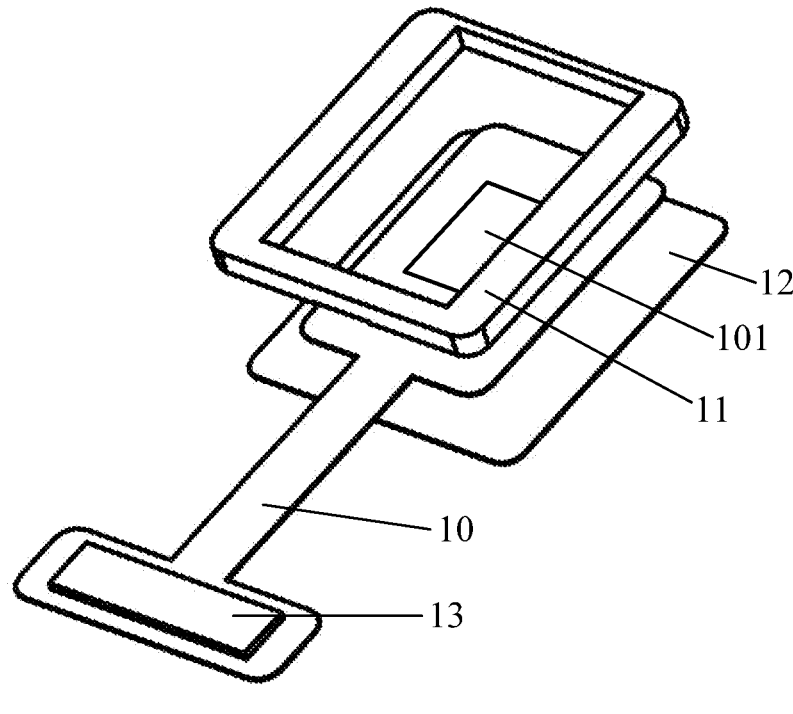
FIG. 4 is a schematic diagram of a structure of the circuit board, the frame body and the heat dissipation plate in the display module of FIG. 2 not being pressed into an integrated structure.

In some exemplary embodiments, as shown in FIG. 3 and FIG. 4, FIG. 3 is a schematic diagram of a structure of the circuit board, the frame body and the heat dissipation plate in the display module of FIG. 2 being pressed into an integrated structure, and FIG. 4 is a schematic diagram of a structure of the circuit board, the frame body and the heat dissipation plate in the display module of FIG. 2 not being pressed into an integrated structure. A surface of the circuit board 10 opposite to the first surface may be provided with a heat dissipation plate 12, the circuit board 10 is provided with a hollow region 101 exposing the heat dissipation plate 12, and the display substrate 21 is contacted with the heat dissipation plate 12 through the hollow region 101. Thus, the display substrate 21 is directly contacted with the heat dissipation plate 12, so that the heat dissipation effect of the display substrate 21 can be improved and the service life of the display module can be increased. Besides, because the heat dissipation plate 12 at least partially replaces the circuit board 10 and contacts with the display substrate 21, the problem of delamination of the display substrate 21 and the circuit board 10 due to a thermal expansion deformation of the circuit board 10 can be avoided. By way of example, the material of the heat dissipation plate 12 may be stainless steel or other material having good heat dissipation property.

In some exemplary embodiments, an adhesive may be used for the adhesive connection between the frame body 11 and the circuit board 10, and between the circuit board 10 and the heat dissipation plate 12. By way of example, the frame body 11, the circuit board 10 and the heat dissipation plate 12 can be pressed together by a hot pressing process. During the hot pressing process, heat sensitive adhesive can be placed between the frame body 11 and the circuit board 10, and between the circuit board 10 and the heat dissipation plate 12. After pressing, the frame body 11 and the circuit board 10 are adhesively connected together by the heat sensitive adhesive, the circuit board 10 and the heat dissipation plate 12 are adhesively connected together by the heat sensitive adhesive.

In some exemplary embodiments, as shown in FIG. 1, the display panel 20 may be provided at an end of the circuit board 10, and the other end of the circuit board 10 can be configured to be connected with an external driving device. By way of example, the other end of the circuit board 10 can be provided with a connector 13 through which the circuit board 10 can be connected with the external driving device.

Figure 5:
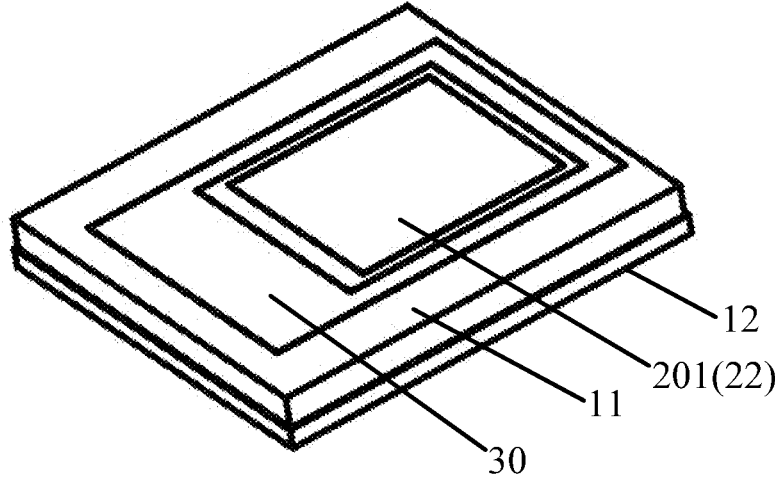
FIG. 5 is a schematic diagram of a structure of a display module according to some exemplary embodiments.
Figure 6:
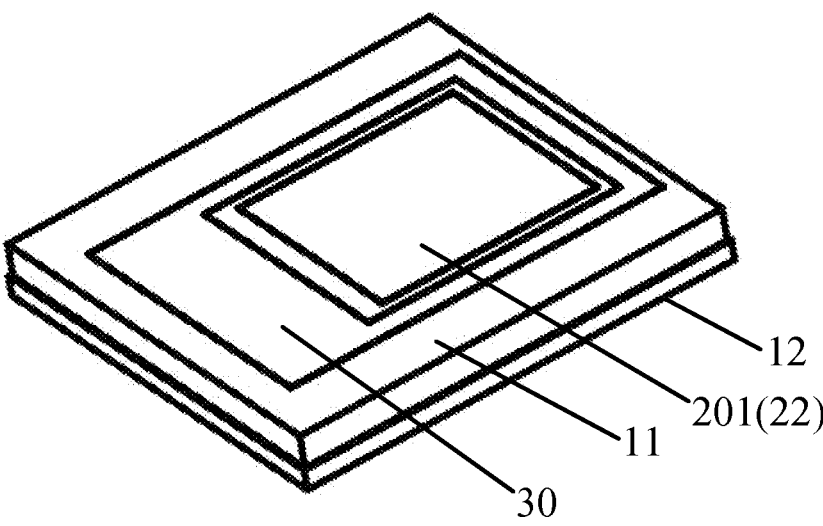
FIG. 6 is an exploded view of the display module of FIG. 5.

In some exemplary embodiments, as shown in FIG. 5 and FIG. 6, FIG. 5 is a schematic diagram of a structure of a display module according to some other exemplary embodiments, and FIG. 6 is an exploded view of the display module of FIG. 5. The frame body 11 may be arranged close to a peripheral edge of the circuit board 10, and the surface of the circuit board 10 opposite to the first surface may be provided with a bonding pad or a connector configured to connect with an external driving device. By way of example, the outer contour shape of the circuit board 10 may be rectangular, or circular, or the like.

In some exemplary embodiments, the circuit board is a carrier board provided with lines, and the circuit board may be, but is not limited to, a printed circuit board, a flexible circuit board, or the like.

In some exemplary embodiments, as shown in FIG. 1 and FIG. 5, an area of the frame body 11 facing away from the surface of the circuit board 10 may be smaller than an area of the fixing adhesive 30 facing away from the surface of the circuit board 10, thus facilitating a narrow frame design.

In some exemplary embodiments, as shown in FIG. 1 and FIG. 5, an orthographic projection of a geometric center of a region enclosed by the frame body 11 on the circuit board 10 and an orthographic projection of a geometric center of a region enclosed by the fixing adhesive 30 on the circuit board 10 may be not overlapped, thus facilitating uniform stress relief within the fixing adhesive 30 and the frame body 11. By way of example, a shape of the regions enclosed respectively by the frame body 11 and the fixing adhesive 30 may both be rectangular, and the rectangular region enclosed by the fixing adhesive 30 is close to a first end of the frame 11, then the geometric center of the rectangular region enclosed by the fixing adhesive 30 is closer to the first end of the frame body 11 than the geometric center of the rectangular region enclosed by the frame body 11.

In some exemplary embodiments, as shown in FIG. 1, an area of an region of the circuit board 10 not covered by the display panel 20 is smaller than an area of an region of the circuit board 10 covered by the display panel 20, so that most area of the circuit board 10 can be covered by the display panel 20 for display, and a small part of area is used for designing external leads, which is beneficial to reduce an impedance of the circuit board 10.

In some exemplary embodiments, the display substrate 21 and the cover plate 22 may be attached by an ultraviolet curable adhesive, a silica gel, an epoxy adhesive or the like. The attaching adhesive between the display substrate 21 and the cover plate 22 may have a high light transmittance, for example, the full-band light transmittance may be greater than or equal to 95%, so that light emitted from the first region of the display substrate 21 can be better emitted from the cover plate 22 through the binding adhesive. The cover plate 22 may be made of glass.

In some exemplary embodiments, the material of the frame body 11 may be epoxy resin, FR4 (a specification of a fire-resistant material), acrylic, stainless steel or the like. The thickness of the frame body 11 may be designed according to the thickness of the display panel 20, for example, the thickness of the frame body 11 may be the same as the thickness of the display panel 20. The thickness of the display module can be reduced by reducing the thicknesses of the frame body 11, the display panel 20 and the heat dissipation plate 12.

In some exemplary embodiments, the surface of the fixing adhesive 30 facing away from the circuit board 10 may be provided with a light shielding layer which may be disposed around the display region 201. By way of example, the light shielding layer may be a light shielding tape or a coated light shielding glue. The light shielding layer can block stray light around the display region 201 and improve the display effect.

An embodiment of the present disclosure further provides a display device which includes the display module described in any of the aforementioned embodiments. The display device may be an augmented reality/virtual reality (AR/VR) display device, such as AR/VR glasses, a helmet display, and the like.

In the accompanying drawings, the size of a constituent element, and the thickness of a layer or an area are sometimes exaggerated for clarity. Therefore, implementations of the disclosure are not necessarily limited to the sizes, and the shapes and sizes of each part in the accompanying drawings do not reflect the true scale. In addition, the accompanying drawings schematically show some examples, and the implementations of the disclosure are not limited to the shapes or numerical values shown in the accompanying drawings.

In the description herein, "parallel" refers to a state in which an angle formed by two straight lines is above −10 degrees and below 10 degrees, and thus includes a state in which the angle is above −5 degrees and below 5 degrees. In addition, "vertical" refers to a state where two straight lines form an angle above 80° and below 100°, and thus includes a state where the angle is above 85° and below 95°.

In the description herein, orientation or positional relations indicated by terms "up", "down", "left", "right", "top", "inside", "outside", "axial direction", "four corners" and the like are based on the orientation or positional relations shown in the drawings, and are for an easy and brief description of the present disclosure and are not intended to indicate or imply that the structures referred to must have a specific orientation, or be constructed and operated in a particular orientation, and therefore these expressions should not be construed as limitations on the present disclosure.

In the description herein, unless explicitly specified and defined otherwise, the terms "connection", "fixed connection", "installation" and "assembly" are to be understood broadly, for example, a connection may be a fixed connection, or a detachable connection, or may be an integral connection. The terms "installation", "connection" and "fixed connection" may refer to a direct connection, or may an indirect connection through an intermediate medium, or may be an internal connection between two elements. Those of ordinary skills in the art can understand the specific meanings of the above mentioned terms in the present disclosure according to specific context.

The invention claimed is:

1. A display module, comprising a circuit board and a display panel provided on a first surface of the circuit board, wherein:

the display panel comprises a display region and a non-display region located at a periphery of the display region;

the first surface of the circuit board is further provided with a frame body, the display panel is located within the frame body, a fixing adhesive is filled between a peripheral edge of the display panel and the frame body, and the fixing adhesive covers the non-display region of the display panel, the display panel comprises a display substrate and a cover plate provided on a side of the display substrate facing away from the circuit board, the display substrate comprises a first region corresponding to a position of the display region and a second region located at a periphery of the first region, wherein the first region is configured to display images and the second region is configured to not to display images, the cover plate completely covers the first region, a peripheral edge of the display substrate protrudes from the cover plate, the fixing adhesive is filled between the peripheral edge of the display substrate and the frame body, and the fixing adhesive completely covers a surface of the display substrate which is not covered by the cover plate, the second region comprises a bonding region located at a side of the first region, and the bonding region is bonded and connected to the circuit board, and the bonding region is provided with a first bonding pad, and the circuit board is provided with a second bonding pad, and the first bonding pad and the second bonding pad are connected by a metal wire.

2. The display module according to claim 1, wherein a surface of the circuit board opposite to the first surface is provided with a heat dissipation plate, the circuit board is provided with a hollow region exposing the heat dissipation plate, and the display substrate is contacted with the heat dissipation plate through the hollow region.

3. The display module according to claim 2, wherein the frame body and the circuit board are adhesively connected by a binder, and the circuit board and the heat dissipation plate are adhesively connected by the binder.

4. The display module according to claim 2, wherein a material of the heat dissipation plate is stainless steel.

5. The display module according to claim 1, wherein an area of a surface of the frame body facing away from the circuit board is smaller than an area of a surface of the fixing adhesive away from the circuit board.

6. The display module according to claim 5, wherein an orthographic projection of a geometric center of a region enclosed by the frame body on the circuit board and an orthographic projection of a geometric center of a region enclosed by the fixing adhesive on the circuit board are not overlapped.

7. The display module according to claim 1, wherein the second bonding pad is located within the frame body and not covered by the display panel, the bonding region is arranged close to a first frame of the frame body, and the second bonding pad is located between the first frame and the bonding region.

8. The display module according to claim 1, wherein the fixing adhesive covers the metal wire.

9. The display module according to claim 1, wherein the frame body comprises a first frame and a second frame opposite to each other, the bonding region is arranged close to the first frame of the frame body, and an area of a part of the fixing adhesive close to the first frame is larger than an area of a part of the fixing adhesive close to the second frame.

10. The display module according to claim 1, wherein the display panel is provided at an end of the circuit board, and the other end of the circuit board is configured to connect with an external driving device.

11. The display module according to claim 1, wherein the frame body is arranged closed to a peripheral edge of the circuit board, and a surface of the circuit board opposite to the first surface is provided with a bonding pad or a connector configured to connect with an external driving device.

12. The display module according to claim 1, wherein a surface of the fixing adhesive facing away from the circuit board is lower than a surface of the cover plate facing away from the circuit board and lower than a surface of the frame body facing away from the circuit board.

13. The display module according to claim 1, wherein an area of the circuit board not covered by the display panel is smaller than an area of the circuit board covered by the display panel.

14. The display module according to claim 1, wherein the display substrate and the cover plate are attached by an ultraviolet curable adhesive, a silica gel or an epoxy adhesive.

15. The display module according to claim 1, wherein a material of the frame body is epoxy resin, acrylic or stainless steel.

16. The display module according to claim 1, wherein a surface of the fixing adhesive facing away from the circuit board is provided with a light shielding layer, and the light shielding layer is arranged around the display region.

17. A display device, comprising: a display module according to claim 1.

* * * * *